FIP8106 OR 3,486,029

RADIATIVE INTERCONNECTION ARRANGEMENT

Filed Dec. 29, 1965 2 Sheets-Sheet 1

INVENTORS:
JOHN R. BARRETT,
THOMAS E. BRAY,
GERALD E. CLAFLIN,
BY Richard V. Lang
THEIR ATTORNEY.

RADIATIVE INTERCONNECTION ARRANGEMENT

Filed Dec. 29, 1965 2 Sheets-Sheet 2

INVENTORS:
JOHN R. BARRETT,
THOMAS E. BRAY,
GERALD E. CLAFLIN,
BY Richard V. Lang
THEIR ATTORNEY.

United States Patent Office
3,486,029
Patented Dec. 23, 1969

3,486,029
RADIATIVE INTERCONNECTION ARRANGEMENT

John R. Barrett, Fayetteville, Thomas E. Bray, Clay, and Gerald E. Claflin, North Syracuse, N.Y., assignors to General Electric Company, a corporation of New York
Filed Dec. 29, 1965, Ser. No. 517,396
Int. Cl. H01j *39/12;* G02f *1/28*
U.S. Cl. 250—217 9 Claims

ABSTRACT OF THE DISCLOSURE

The invention relates generally to the use of light coupling for electrical circuit interconnection. In a practical application of the invention, a light emitter and a light receptor are used for coupling signals between separate electrical circuits. The light emitter is a gallium arsenide PN junction device whose light output lies in the near red region of the spectrum and which is modulated in accordance with an applied signal. The light receptor is a gold compensated silicon photoconductor optimized for operation in the same spectral region and interconnected with the base of a transistor amplifier for amplification of the applied optical signal. The interconnection arrangement operates at normal ambient temperatures at frequencies as high as one megacycle and is capable of unity current gain.

Figure 1:
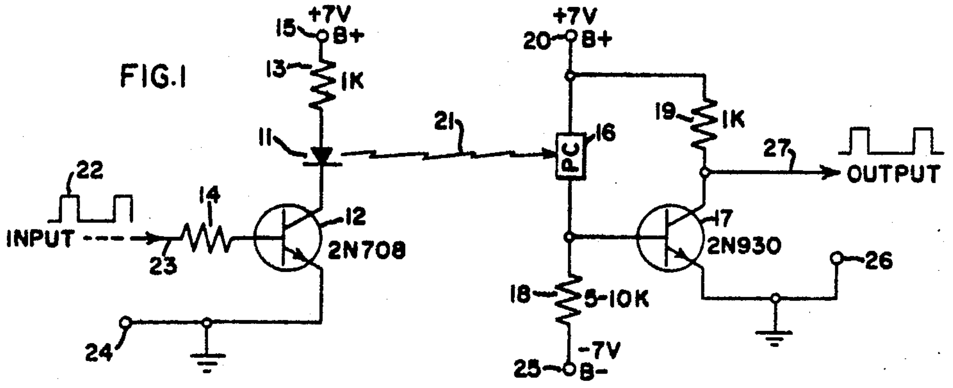

Recent developments in the fabrication of electronic circuits have led to the ability to fabricate electrical circuits of small size, high circuit complexity, at a low cost not greatly increased with circuit complexity, and with a reliability that is unparalleled in the history of electronics. A very common family of such microcircuit fabrication techniques is referred to as the integrated circuit technique. In general, integration implies that the electrical components ultimately become an integral part of some common member upon which they are supported. In one form, the common member may be a substrate of a semiconductor material such as silicon into which by successive diffusion and masking processes a collection of the active components of the circuit such as the transistors and the diodes are formed. The interconnection of these active devices and the formation of passive components such as resistors and capacitors and inductances may be accomplished by one of several different methods. One method, which has been used to provide conductive paths and resistive components, has been the use of diffusion techniques similar to those used in the formation of the active components. Another method, which is referred to as the thin film technique, has also been used. In the thin film technique by which both conductors and capacitors and simple inductors can be formed, the conductors are laid down by successive depositions of conductive-resistive, and insulative-dielectric layers. In general, circuits whose passive components are formed by either method are referred to as "monolithic circuits," when the underlying sheet or substrate is of monocrystalline semiconductor material.

A practical limitation on the reliability of these microcircuits is the present means by which connections are made to them. Such connection is necessary when it is desired to interconnect a plurality of microcircuits to perform more complex system functions, or when it is desired to introduce or to take off associated signal, energization, and perhaps timing electrical quantities. At the present time, connections are largely restricted to wire type connections requiring a bonding or welding of a thin wire between a point on the microcircuit and the somewhat more substantial external terminal, which is sufficiently rugged for traditional soldering or other mechanical interconnection. Such connection techniques are less reliable by a factor of several orders than the techniques by which the internal connections within the microcircuits themselves are made. In addition to reducing the reliability, these techniques often greatly enlarge the size of the resulting circuitry.

The present invention is directed toward increasing the reliability in microcircuit interconnection and toward doing the same with a minimum increase in circuit size. The present invention employs the light coupling technique for making connections to and between microcircuits.

It has been recognized that the light coupling technique might provide a partial solution for the connection problem to microcircuits. It has also been recognized that in such application the unilateral flow of electrical quantities possesses advantages in a circuit environment where it is desired to minimize feedback. In addition to unidirectionality, the light coupling technique permits additional flexibility in electrical design since multiple inputs which are coupled to a common output or multiple outputs which are coupled to a common input may themselves be mutually uncoupled. While the desirability of using optical coupling has been recognized, the limitations on available devices and techniques have tended to rule them out from serious consideration.

In order to satisfactorily perform the function of microcircuit interconnection, the light coupling technique should meet certain practical requirements. For the signal connection to be efficient, there should be a minimum of signal attenuation. In many cases it may be desirable for the interconnection to provide neither attenuation nor gain and in that respect be equivalent to a simple conductive connection. The signal connection path should possess substantial useful signal bandwidth. The signal connection should be compact so as not to increase the gross size of the microcircuits it interconnects. The connection should be of the same or greater reliability than the microcircuits it connects. The techniques for formation of the interconnection elements should be compatible with the techniques used in formation of the microcircuit structure in the first place.

A number of approaches to light coupling have been proposed in the past. One such approach has been to use a light source of the gallium arsenide junction type in combination with a phototransistor. The base region of the phototransistor is subjected to illumination by the light source and in response generates currents in the base region. These currents are, in turn, amplified. The design problem which the phototransistor represents is that to optimize the base region for high quantum efficiency with the light of the long wavelength provided by the gallium arsenide light source; the junction should be reasonably thick—typically 14 to 30 microns. A base region of this thickness, however, is far from optimum in achieving satisfactory speed of response. Furthermore, achieving an optimum design in an integrated circuit configuration poses very substantial processing or fabrication problems. A less promising approach involves a photodiode. Because of the lack of a current gain mechanism within the photodiode, output amplification requirements, assuming one is seeking an overall current transfer ratio of unity or greater, may ordinarily require at least two stages of transistor gain.

Accordingly, it is an object of the present invention to provide an improved radiation interconnection of high reliability.

It is a further object of the present invention to provide an improved radiation interconnection arrangement having improved gain bandwidth characteristics.

It is a further object of the present invention to provide an improved radiation interconnection arrangement for use with microcircuits having substantial bandwidth and having a current transfer ratio of close to or in excess of unity.

It is a further object of the present invention to provide a radiation interconnection arrangement of high reliability and ease of assembly, which is compatible with monolithic microcircuit.

These and other objects of the invention have been achieved in one practical form of the invention by the combination of a gallium arsenide junction type light emitter formed on one microcircuit, radiantly coupled with a silicon photoconductor light detector formed on a second microcircuit, the "photodetector" taking the form of a three-layer device having a central or active region of gold compensated epitaxial silicon. The silicon photodetector is coupled in circuit with a transistor in order to achieve an overall configuration in which unity current gain may be achieved at frequencies of 1000 kilocycles. This configuration is smaller than most direct connections and of high reliability. In order to enhance the overall operation of the circuit and to render the same more immune to ambient variations, an exemplary circuit configuration is proposed involving a combination of two light emitters connected to operate in mutually opposite states of conductivity, each coupled with one of a pair of photodetectors, the photodetectors being arranged in a voltage dividing configuration in combination with a transistor.

The novel and distinctive features of this invention are set forth in the claims appended to the specification. The invention itself, however, together with further objects and advantages thereof, may be understood by reference to the following description and accompanying drawings in which:

FIGURE 1 is a schematic circuit diagram illustrating a first radiative interconnection arrangement in accordance with the present invention wherein the light reception or output portion of the arrangement utilizes a photoconduction element coupled between the base and collector of a cooperating transistor element.

Figure 2A:
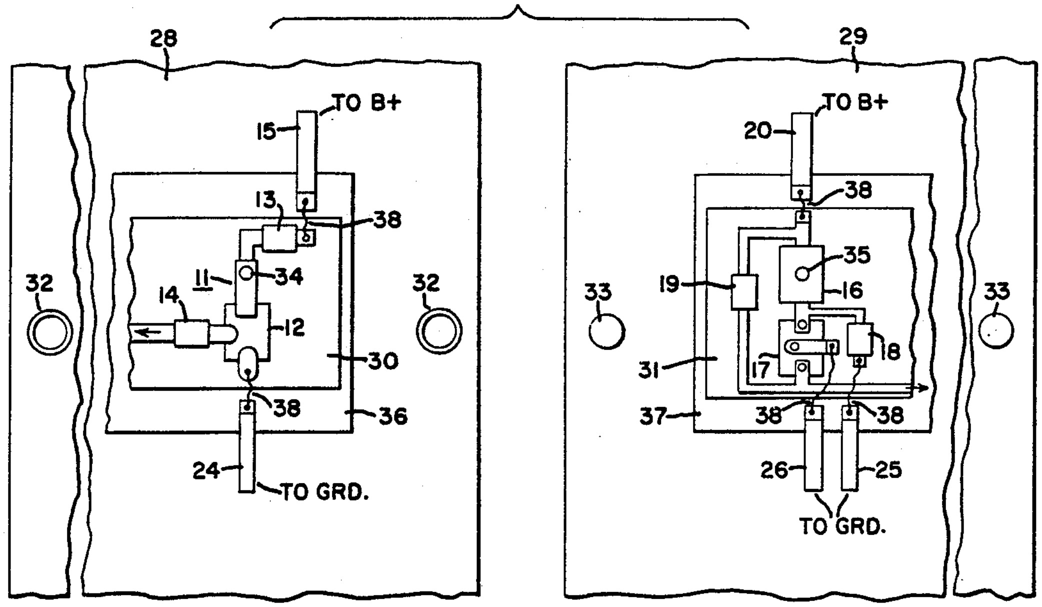
Figures 2B, 2C:
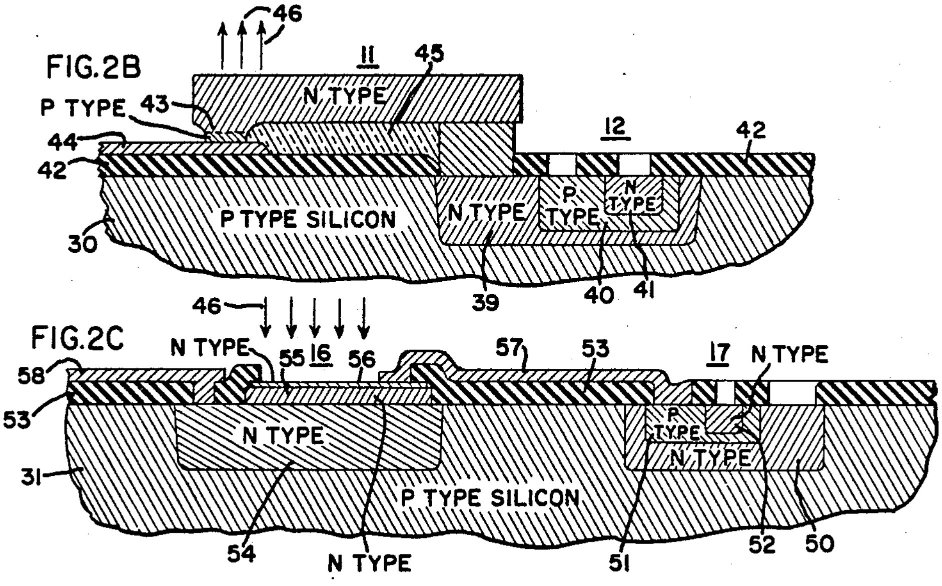

FIGURES 2A, 2B and 2C are drawings illustrative of the mechanical configuration of the radiative interconnection embodiment of FIGURE 1 employing integrated circuit techniques. FIGURE 2A is a plan view illustrating both the light emission and the light reception portions of the invention. FIGURE 2B illustrates a cross section of the light emission portion to provide a more detailed explanation of its construction. FIGURE 2C illustrates a cross section of the light reception portion to provide a more detailed explanation of its construction.

Figure 3:
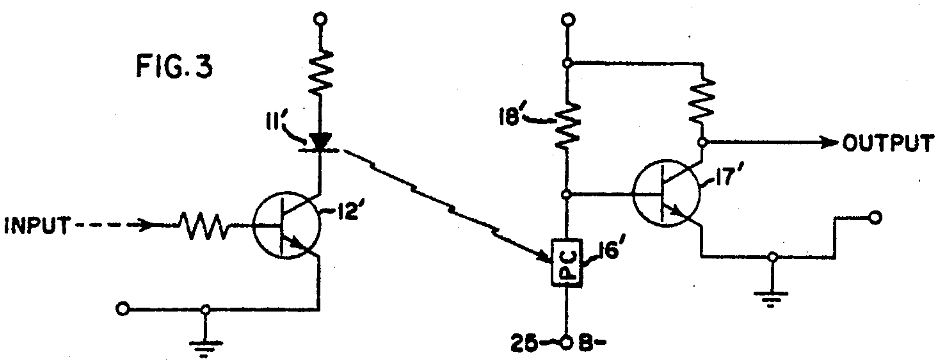
Figure 4:
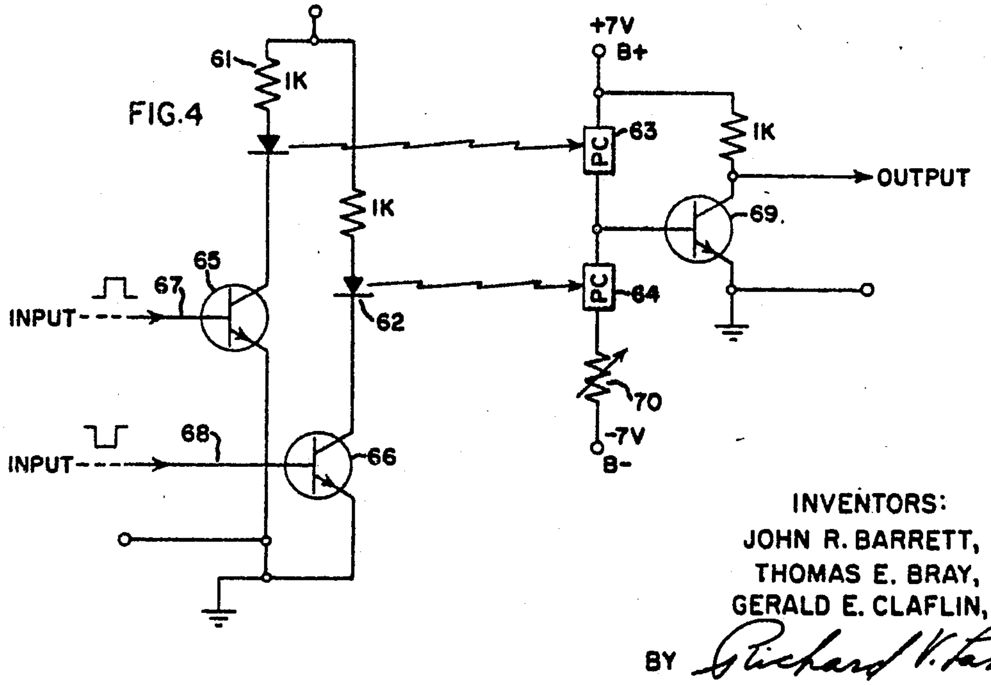

FIGURE 3 is a schematic circuit diagram illustrating a second novel radiative interconnection arrangement wherein the output portion utilizes a photoconduction element coupled between the base and emitter of the cooperating transistor element; and FIGURE 4 is a schematic circuit diagram illustrating a third novel radiative interconnection arrangement wherein the output portion utilizes a pair of photoconduction elements coupled respectively between the base and collector, and the base and emitter of the cooperating transistor element.

The radiative interconnection arrangement of FIGURE 1 comprises a light emission portion comprising a junction semiconductor light emitter 11 and a signal controlled energization circuit for the light emitter comprising a transistor 12, resistances 13 and 14, and terminal 15 for connection to a source of B+ potentials. The light reception portion of the circuit comprises a photodetector 16, transistor 17 in amplifying configuration, additional resistances 18 and 19, and a terminal 20 for connection to a source of B+ potentials. As illustrated in the drawing, the light emission portion of the arrangement is coupled to the light reception portion by means of a light transmission path 21 between the light emitter 11 and the light receptor or photodetector 16.

In operation, the FIGURE 1 embodiment receives an input signal containing information in the form of positive going pulses 22 at its signal input lead 23. The signal is applied between the lead 23, which is coupled through resistance 14 to base of transistor 12, and the ground terminal 24 to which the emitter of transistor 12 is connected. The collector of transistor 12 is serially connected through light emitter 11 and resistance 13 to the terminal 15 for energization by positive biasing potentials. The transistor 12 is thus connected in common emitter configuration, and is arranged to control the current flow through the light emitter 11, and thereby the light produced therein in accordance with the input signal 22 applied to the base electrode. Preferably, transistor 12 is operated in a switching mode, being biased to be substantially non-conductive and thereby inhibit any substantial current flow through the light emitter 11 in the absence of an applied pulse while in the presence of an applied pulse it becomes fully conductive. By this mode of operation, the light emission is switched from an off to an on condition in response to the input signal.

Light source 11 may typically require from 5 to 20 milliamperes of current and require on the order of 20 milliwatts of power. The transistor element 12 is therefore designed to have sufficient power, current, and voltage handling capabilities for performing this function. In the usual practical application of the invention, a separate power or buffer amplifier need not be added to a functional circuit to provide operation at the requisite levels. Instead, the transistor element 12 and its associated electrical components may form a portion of a pre-existing functional circuit, such as the portion of a flip-flop. The flip-flop may accommodate this additional optical coupling function by the selection of transistor elements having the requisite capacities.

In the light reception portion of the invention, the transistor 17 has its base electrode coupled to photodetector 16, which in turn is radiantly coupled by the path 21 to the light emitter 11. The base electrode of transistor 17 is also connected through a resistance 18 to the terminal 25 for connection to a source of B minus potentials. The collector electrode of transistor 17 is connected through load resistance 19 to the terminal 20 for connection to a source of B plus potentials. The emitter of transistor 17 is coupled to the ground terminal 26. The resistance 18 is selected to be approximately equal to that of the photodetector 16 being chosen to bias the transistor 17 slightly positive for forward conduction.

By these provisions, light falling on the photodetector 16 containing signal information is converted into an electrical signal which is applied to the base of the transistor 17. The transistor 17 is arranged to amplify the derived electrical signal and an amplified version thereof appears at the collector of transistor 17 on the output lead 27, where it may be coupled to subsequent electronic circuitry. By suitable selection of the values for the constituent electrical components and by care in insuring a high degree of efficiency in coupling the light from the light emitter 11 to the photodetector 16, one may achieve coupling between the input and the output portions of the circuit characterized by a unity current transfer and practically zero back coupling from the output circuit to the input circuit. Typical circuit values for the circuit elements and transistor equivalents have been indicated on FIGURE 1. A more detailed description of the light emitter 11 and the photodetector 16 will be provided below. Optimum optical coupling may be achieved by a number of different techniques employing coupling media having high indices of refraction. While indices approaching that of silicon would be preferred, substantial improvement is achieved by use of any media having an index substantially exceeding that of air. One technique requires the use of a small quantity of oil such as is used in oil immersion lenses for microscopes, confined between the emitting surface of the light emitter 11 and the photodetector 16. A similarly efficient coupling may be achieved by use of a transparent resilient silicone layer disposed between the light emitter 11 and the light receptor 16.

The embodiment illustrated on FIGURE 1 may take the mechanical form illustrated in FIGURES 2A, 2B and 2C. The circuit form illustrated is presently referred to as "integrated" in that the components are not separately formed and attached to the ultimate circuit by their leads as have been conventional in the past, but are instead formed as an integral unit upon (or into) an insulating or otherwise inert support or substrate. The arrangement illustrated in FIGURES 2A, 2B and 2C illustrates the application of the invention to a form of integrated circuit which is often referred to as "monolithic" in that a substrate is employed which can be locally rendered electrically inactive or active by suitable processing techniques to form both passive and active electrical components, mutually isolated or interconnected at will. Such a substrate may be a chip of silicon, which by suitable processing may be locally transformed into electrically distinct transistors, diodes, and electrical resistances. These components formed in the substrate are at the same time electrically interconnected to form small and highly sophisticated functional electrical circuits.

The manner in which the present invention may be carried out in a monolithic configuration, to which it is particularly well adapted, is illustrated in these figures. Referring now to FIGURE 2A, two detachable printed circuit members 28 and 29 are shown. Printed circuit member 28 provides the mechanical support for the light emission portion of the invention which is carried out at the silicon chip 30. Printed circuit member 29 provides mechanical support for the light reception portion of the apparatus which is carried out on a silicon chip 31. The members 28 and 29 are arranged for precise face-to-face disposition with aligning sockets 32 associated with the member 28 for receiving the aligning pins 33 on the member 29. These pins and sockets are arranged to precisely position light emitting region 34 of the light emitter 11 in close opposition to the light reception portion 35 of the photodetector 16.

The silicon chips 30, 31 being both thin and fragile, are supported by a conventional technique upon a more substantial ceramic or glass support as illustrated at 36 and 37, respectively. The support members 36 and 37 also support the rather substantial solder terminal pins 15, 20, 24, 25, and 26. (These terminals correspond to similarly numbered terminals appearing in FIGURE 1.) One such support is referred to as a "flat pack." These solder terminals are coupled at one end by fine wires 38 attached by thermal compression bonds, or the like, to connection points on the monolithic or silicon portion of the circuit. The solder terminals at their other ends, may be soldered or otherwise connected to circuits (not illustrated) formed upon the printed circuit boards 28 and 29, which may provide bias sources and ground connections and other auxiliary functions to the circuit.

Considering now the execution of the circuit upon the monolithic or silicon member 30 as illustrated in FIGURE 2A; the light emitter 11 is represented by a generally rectangular outline which in turn overlaps the rectangular outline defining the transistor 12. The overlap between elements 11 and 12 is at the site of the interconnection between the N region of the light emitter 11 and the collector of the transistor 12. Transistor 12 is provided with two other connection points which provide connection to the base and to the emitter. The base lead is connected to deposited resistances 14 and emitter lead is coupled by means of a thermal compression bond to the wire 38, which is attached to the ground terminal 24. Similarly, a connection is made between the P region of the light emitter 11 and the resistance 13. The other terminal of the resistance 13 is coupled through a lead 38 to the terminal 15 which is coupled to a source of B+ potentials upon the printed circuit board 28. The transistor 12 and resistances 13, 14 as well as the interconnections may be in a conventional manner.

FIGURE 2B indicates in somewhat greater detail the construction of the light emitter 11 and its assembly upon the silicon chip 30. The transistor 12 is directly formed into the silicon chip 30. This may be done by employing P silicon for the member 30 and successively forming an N region for the creation of the collector as illustrated at 39 and then within this N region, forming a somewhat smaller P region 40 for the base, and finally, within the P region, forming an N type region for the emitter 41. Typically, the upper surface of the silicon chip is provided with a continuous insulating silicon dioxide layer 42 broken only at these connection points to the separate transistor regions.

The light emitter 11 is a p-n junction formed from a small chip of single crystal approximately doped N type gallium arsenide. The chip is typically .006 inch in thickness and of rectangular configuration with a mesa 43 containing the junction formed on its under surface. These chips may have impurity concentrations in the range of from $10^{16}$ to $3\times10^{18}$/cm.$^3$, the higher limits being preferred.

In formation of the junctions, zinc is diffused into the surface of the chip to form a P region typically 4 or 5 microns deep. Subsequently, the bar is masked at one end with a circular mask and etched to remove not only the surrounding P region, but a substantial portion of the surrounding N region to create the mesa.

The mesa 43, which is so formed upon the chip and whose perimeter bounds the junction is the site for light emission. The mesa may be 2 to 3 thousandths of an inch in thickness, and its diameter is usually less than ten thousandths (.010) of an inch. The smaller size mesa diameters (in the neighborhood of five thoustandths (.005) of an inch or less) are typical for convenient signal currents on the order of 1 to 20 milliamperes. This provides sufficient current density to operate at high quantum efficiency. Escape quantum efficiency of the light emitting diode is greatly enhanced by use of the mesa dimensions indicated above and by shaping the walls of the mesa to have a slope in the vicinity of 45° which may be accomplished during the etching process. The effect of these measures is to collect a very substantial amount of the light created in the juncion and to reflect it upwardly through the chip as shown at 46.

At room temperatures, a light emitter of the general construction just outlined may be expected to have a quantum efficiency lying between 0.7 to 1.4 percent in practical devices. The emitted light lies primarily in the range of from 8900 to 9200 angstrom units wavelength.

The gallium arsenide light emitting diode 11 is attached at the P and the N regions to the monolithic circuit. The mesa 43 is bonded to the surface conductor 44, which is in turn supported upon substrate 30 by the insulating layer 42. The N region is bonded to the N region 39 of the transistor 12. For additional support, a low melting point glass may be disposed between the gallium arsenide member and the silicon dioxide layer as illustrated at 45. By this method of construction, a very convenient light source is created, adapted to operate at indicated currents at power levels in the vicinity of 20 milliwatts. The gallium arsenide light emitting diode is thus attached to the monolithic member without flying leads and when finally bonded becomes an integral unit with the monolithic member.

The light emitter is not in itself a part of the present invention. It is, however, the subject matter of copending application Ser. No. 517,395, now U.S. Patent 3,353,-051, filed Dec. 29, 1965, for Messrs. Barrett and Jensen.

The light reception member comprising a printed circuit board 29, a silicon member 31 and an insulating support member 37 occupy the right hand portion of FIGURE 2A. In the drawing, the photodetector 16 is illustrated by a rectangular outline and the cooperating transistor 17 is also represented by a rectangular outline. These members are formed in the silicon member 31 together with resistances 18 and 19 with thich they are interconnected in the manner schematically illustrated in FIGURE 1.

The exact manner in which the photodetector 16 and the transistor 17 are formed upon the silicon member 31 can best be understood by reference to FIGURE 2C which illustrates these members in cross section. The transistor 17 has an N type region shown at 50 forming a collector region, a P type region shown at 51 forming the base region and an N type region at 52 forming the emitter. These are active regions of the transistor 17. Silicon dioxide coating 53, which generally coats the surface of the silicon member 31, has openings into each of these regions for the purpose of making electrical connection thereto.

The formation of the transistor 17 may be achieved by conventional techniques.

The photodetector 16 is of a new design especially adapted for formation into the silicon member 31 and having optical properties which make it particularly appropriate for use with a gallium arsenide light source of the type described above.

The configuration of the photodetector 16 is that of a three layer sandwich. The first layer, formed directly into the silicon member 31, is a highly doped N+ region 54, formed by diffusion into the silicon member. The thickness of this region may be from one to two thousandths of an inch and the doping concentration may be from $10^{17}$ to $10^{19}$ per cu. cm. so as to achieve a .01 to .001 ohm cm. resistivity. On the surface of the N+ region 54 an epitaxial layer 55 is grown to a thickness of from one to two thousandths of an inch. This region is also N type and has a donor density of from $10^{15}$ to $6\times10^{15}$ donor per cu. cm. providing a resistivity of from 1 to 5 ohm cm. It is gold compensated to three times the donor density. Finally upon the epitaxial layer 55, a thin, highly doped N+ layer 56 is applied. This last layer may be from .1 to .05 of a thousandth of an inch in thickness and may be doped to the same resistivity as the lower N+ region 54.

The active region of the photodetector is the epitaxial region 55 and the highly doped N+ regions 54 and 56 serve primarily as electron replenishing or ohmic contacts to the centrally disposed epitaxial region.

As illustrated in FIGURE 2C, electrical contact is taken from the N+ region 54 by a deposited conductor 57 which makes contact with it in a small gap in the overlying silicon dioxide insulating layer. The deposited conductor may be of gold and adherence to the lower N+ region 54 may be enhanced by initially diffusing and alloying a small gold contact upon its surface. By a similar technique, contact may be made between the upper N+ region 56 of the photodetector to a connection 58 which makes connection to the P collector region 51 of the transistor 17.

In formation of the photodetector, the N+ region 54 is formed first by a conventional diffusion technique. The donor material may be selected from the class of antimony, arsenic or phosphorous; antimony generally being preferred because of the slowness with which it may be expected to diffuse into the epitaxial region 55 which is subsequently formed upon it. The one to 2 mil thickness of the layer 54 is selected primarily from considerations of achieving an adequate electrical contact with the under surface of the epitaxial region.

The epitaxial region 55 may preferably employ phosphorous donors. The epitaxial region is gold compensated, as indicated above, in that gold atoms have been diffused into the epitaxial region to approximately three times the donor density. The introduction of the gold into the epitaxial region may best take place after the formation of the uppermost N+ region 56 and it is diffused directly through that layer. It preferably occurs at a temperature of from 950° to 1060° C., thus achieving the 1 to 5 ohm cm. resistivity desired. The thickness of the uppermost layer 56 is selected to be of the minimum thickness suggested, consistent with the processing technique employed and consistent with permitting light to pass unattenuated into the active region 55 of the photodetector, while at the same time providing a satisfactory ohmic contact to the active region.

The thickness of the epitaxial region 55 of from one to two thousandths of an inch is selected to insure interaction with most of the incident photons which have energies greater than the gap energy for whole-electron pair generation and a steady state gain of approximately 40 electrons per incident photon in the active region has been observed. The configuration herein employed operated with potential difference of approximately 7 volts and exhibited rise times in the range of .3 to 1 microsecond with fall times in the range of .2 to 1.2 microseconds. Steady state quantum gains of up to 60 have been measured.

The photoconductor is itself a subject of copending application Ser. No. 517,366, now U.S. Patent 3,436,613, filed Dec. 29, 1965, for Messrs. Gerhard and Ing.

In the arrangement just described essentially unity current gain may be achieved between the current input to the emitter 11 and the current output of the transistor 17. When unitary gain is not desired, one may readily obtain other output levels which are useful in conventional circuitry without further amplification. Both the light emitting and the light coupling portions of the circuit are readily applied to monolithic silicon configurations and operation at a rate of a megacycle has been achieved. The signal connection through the light source in these applications has extremely high backward isolation.

The electrical arrangement of FIGURE 1 may be subjected to a number of variations. One such variation is illustrated in FIGURE 2 wherein the photodetector 16' is coupled between the base and emitter of the output transistor 17'. When this arrangement is employed, a phase inversion in the output signal occurs. Other circuit details may, however, be retained without substantial modification. Similarly, one may place the light emitter 11' in the emitter circuit of transistor 12'. This variation is not illustrated.

In addition, the invention may take the form illustrated in FIGURE 4 wherein a pair of light emitters 61 and 62 are coupled respectively to separate photodetectors 63 and 64. The photo emitters are of the type previously described and are respectively coupled to the output of control transistors 65 and 66 which are arranged to be gated into mutually opposed states of conduction by input signals 67 and 68 respectively. The supply arrangement for the light emitters 61 and 62 may in fact be conveniently provided from the active elements in a conventional multivibrator stage, the transistors 65 and 66 being such active elements.

The light receptors 63 and 64 are arranged to form a voltage divider between a source of B+ potentials and B− potentials with the base of the output transistor 69 being coupled to a tap on the voltage divider. An additional resistance 70 may be connected to one leg for the purpose of balancing the output transistor for normal forward conduction.

The push-pull arrangement of FIGURE 4 is relatively insensitive to ambient light, and the presence of the voltage divider configuration for adjusting the base bias potential of the transistor 69 tends to stabilize its operating point against temperature variations to which the photodetectors are normally subject.

The silicon photodetector herein disclosed is highly efficient in the near red and infrared portions of the spectrum and can be readily adjusted by varying the thickness of the light absorbing epitaxial region, design of the upper conductive layer and other parameters to achieve optimum optical coupling with the red emitting light sources herein described iwthout compromise of the gain bandwidth performance of the combination. This mutual electro-optical compatibility, as wall as joint compatibility with integrated circuit fabrication techniques, leads o a highly satisfactory radiative signal connection for integrated circuits.

While specfic embodiments of the invention have been shown, modifications and changes therein may be made by those skilled in the art without departing from the spirit of the invention. Such changes may consist of rearrangements of the kind suggested in the circuit configuration of FIGURES 1, 3 and 4 as well as in modifications in the execution and construction of the gallium arsenide light emitter, or in the recipient gold doped silicon photodetector, or transistor which are all cooperatively associated. Accordingly, it is intended in the appended claims to cover all such modifications.

What is claimed as new and desired to be secured by Letters Patent in the United States is as follows:

1. A radiative interconnection arrangement comprising a light emitting semiconductor device on a first circuit member producing a light signal lying in a given spectral region and modulated in accordance with an input electrical signal, a silicon photoconductor and a transistor amplifier on a second circuit member, said photoconductor exhibiting quantum gain and having a planar light absorbing layer optically coupled to said light emitting semiconductor and having a thickness optimized for absorption of light in said spectral region; said light absorbing layer being of one conductivity type; said photoconductor further comprising two conductive layers of said one conductivity type of relatively higher conductivity than said light absorbing for electrical connection thereto, the base of said transistor amplifier being electrically coupled to said photoconductor for amplifying the electrical effect therein so as to reproduce said input electrical signal at a useful amplitude in said second circuit member.

2. A radiative interconnection arrangement as set forth in claim 1 wherein said transistor amplifier is a single transistor stage adjusted to provide a unity output signal for a unity signal applied to said light emitting device.

3. A radiative interconnection arrangement as set forth in claim 1 wherein said light emitting semiconductor device is a gallium arsenide PN junction, emitting light in the near red region of the spectrum and wherein said photoconductor is a compensated silicon photoconductor optimized for said spectral region.

4. The radiative interconnection arrangement as set forth in claim 3 wherein said photoconductor is gold compensated.

5. A radiative interconnection arrangement as set forth in claim 1 wherein said first circuit member is of monolithic construction employing a silicon substrate to which said light emitting device is attached and wherein said second circuit member is of monolithic construction having a silicon substrate, said photoconductor being formed integrally on said substrate.

6. A radiative interconnection arrangement as set forth in claim 5 wherein said photoconductor is formed with a light absorbing layer parallel with the plane of said second substrate and having a transparent electrical contact layer, formed on the surface of said contact layer remote from said substrate so as to facilitate coupling to light directed orthogonally toward the surface of said second substrate.

7. A radiative interconnection arrangement as set forth in claim 6 wherein said light absorbing layer is an epitaxial layer formed on said substrate and a second electrical contact layer is formed by diffusion into said substrate.

8. A radiative interconnection arrangement as set forth in claim 5 wherein said light emitting device is a gallium arsenide PN junction device, emitting light generated in its junction plane through its N region, said light emitting device being bonded to said substrate with said P region toward said substrate so as to direct light orthogonally from said substrate, and wherein said photoconductor is formed with a light absorbing layer parallel with the plane of said second substrate and having a transparent electrical contact layer, formed on the surface of said contact layer remote from said substrate so as to facilitate coupling to light directed orthogonally toward the surface of said second substrate and thereby permit interconnection of said substrates by arranging them in face-to-face relation.

9. A radiative interconnection arrangement as set forth in claim 1 wherein said light emitting semiconductor device is electrically connected between the terminals of a source of energizing potentials in series with a current setting resistance and the principal current path of a transistor device operated in a switching mode under the control of an input signal, and wherein said transistor amplifier of said second circuit member has its transistor base electrode coupled to a tap on a voltage dividing bridge comprised of said photoconductor and an additional resistance, and having a load resistance coupled to the transistor output electrode, said circuit parameters being selected to provide an output signal level at said output electrode comparable to the signal level at said light emitting device.

References Cited

UNITED STATES PATENTS

| | | | |
|---|---|---|---|
| 3,026,498 | 3/1962 | Galliers | 250—215 |
| 3,038,085 | 6/1962 | Wallmark | 307—88.5 |
| 3,051,840 | 8/1962 | Davis. | |
| 3,082,392 | 3/1963 | McLean | 250—199 |
| 3,105,906 | 10/1963 | Schultz | 250—199 |
| 3,122,638 | 2/1964 | Steele | 250—199 |
| 3,196,275 | 7/1965 | Atkins | 307—311 |
| 3,209,154 | 9/1965 | Maring | 250—212 |
| 3,233,111 | 2/1966 | Pike. | |
| 3,246,162 | 4/1966 | Te Ning Chin. | |
| 3,283,237 | 11/1966 | Williams | 250—209 |
| 3,315,176 | 4/1967 | Biard. | |
| 3,319,080 | 5/1967 | Cornely. | |
| 3,321,631 | 5/1967 | Biard. | |
| 3,333,106 | 7/1967 | Fisher. | |

OTHER REFERENCES

M. A. Gillec et al., Electronics, New Approach to Microcircuit Interconnection, Nov. 22, 1963, p. 23.

W. Luft, Electronic Industries, Understanding Silicon Photocells, February 1961, p. 102.

R. H. Rediker et al., Electronics, GaAs Diode, Oct. 5, 1962, pp. 44, 250–199.

H. E. Haynes, RCA Tech. Notes, Circuit for Generating Opt. Carrier, March 1965, RCTN No. 611.

B. L. Bryson, IBM Tech. Disclosure Bulletin, Push-Pull Ampl., July 1961, pp. 50, 307–311.

ROBERT L. GRIFFIN, Primary Examiner

ALBERT J. MAYER, Assistant Examiner

U.S. Cl. X.R.

250—199, 211